United States Patent
Usa et al.

(10) Patent No.: US 7,807,988 B2
(45) Date of Patent: Oct. 5, 2010

(54) ELECTRON BEAM LITHOGRAPHY APPARATUS AND METHOD FOR COMPENSATING FOR ELECTRON BEAM MISALIGNMENT

(75) Inventors: Toshihiro Usa, Odawara (JP); Kazunori Komatsu, Odawara (JP)

(73) Assignee: FUJIFILM Corporation, Tokyo (JP)

( * ) Notice: Subject to any disclaimer, the term of this patent is extended or adjusted under 35 U.S.C. 154(b) by 407 days.

(21) Appl. No.: 11/851,188

(22) Filed: Sep. 6, 2007

(65) Prior Publication Data

US 2008/0054188 A1 Mar. 6, 2008

(30) Foreign Application Priority Data

Sep. 6, 2006 (JP) ............................. 2006-241466

(51) Int. Cl.
*H01J 3/26* (2006.01)
*G11B 9/10* (2006.01)
(52) U.S. Cl. ............ 250/492.3; 250/491.1; 250/492.22; 360/135; 430/296; 430/942; 369/101
(58) Field of Classification Search ............ 250/492.22, 250/491.1
See application file for complete search history.

(56) References Cited

U.S. PATENT DOCUMENTS

| 5,389,858 A | * | 2/1995 | Langner et al. .............. 315/370 |
| 5,892,230 A | * | 4/1999 | Goodberlet et al. ..... 250/361 R |
| 7,026,098 B2 | | 4/2006 | Komatsu et al. |
| 2004/0091817 A1 | | 5/2004 | Komatsu et al. |

FOREIGN PATENT DOCUMENTS

| EP | 1 418 576 A2 | 5/2004 |
| JP | 2004-158287 A | 6/2004 |
| KR | 10-2004-0040372 A | 5/2004 |

\* cited by examiner

*Primary Examiner*—Jack I Berman
(74) *Attorney, Agent, or Firm*—Sughrue Mion, PLLC

(57) ABSTRACT

Linear movement direction of the stage and the actual deflection direction of the electron beam deflected by the first command signal for deflecting the electron beam in the linear movement direction of the stage do not necessarily align with each other for reasons such as the disposition precision of the stage driving device, a lens system, and the deflecting device. Therefore, the first command signal output from the first command device is processed based on the angle between the linear movement direction of the stage driven by the stage driving device and the deflection direction of the electron beam deflected by the first command signal so that the deflection direction of the electron beam aligns with the linear movement direction of the stage. With this processed first command signal, the deflection direction of the electron beam can be changed (rotated) to align with the linear movement direction of the stage.

29 Claims, 10 Drawing Sheets

RELATED ART

RELATED ART

RELATED ART

RELATED ART

ELECTRON BEAM LITHOGRAPHY APPARATUS AND METHOD FOR COMPENSATING FOR ELECTRON BEAM MISALIGNMENT

BACKGROUND OF THE INVENTION

1. Field of the Invention

The present invention relates to electron beam lithography apparatuses and methods for compensating for electron beam misalignment, and more particularly to a technique for compensating for drawing position misalignment of an electron beam.

2. Description of the Related Art

An electron beam lithography apparatus has been proposed that uses an electron beam to draw elements constituting a pattern onto resist provided on a substrate in order to form a pattern of projections and depressions or the like when producing, e.g., a master carrier for magnetic transfer (Japanese Patent Application Laid-Open No. 2004-158287).

FIGS. 7A and 7B are a side view and a plan view of main parts of a conventional electron beam lithography apparatus respectively.

As shown, the electron beam lithography apparatus 1 includes: a rotating stage unit 20 including a rotating stage 14 supporting a substrate 12 with resist formed thereon and a spindle motor 18 having a motor shaft provided to align with the center axis 16 of the rotating stage 14; a shaft 22 penetrating part of the rotating stage unit 20 and extending in a certain radial direction R (Y) of the rotating stage 14; and a linear moving device 24 for moving the rotating stage unit 20 along the shaft 22. A precisely threaded rod 26 disposed in parallel with the shaft 22 is screwed in part of the rotating stage unit 20. The rod 26 is designed to be rotated in normal and reverse directions by a pulse motor 28. The rod 26 and the pulse motor 28 constitute the linear moving device 24 for the rotating stage unit 20.

The electron beam lithography apparatus 1 further includes an electron gun 30 emitting an electron beam EB, and a deflecting device having electrostatic deflecting plates 32 and 34 for deflecting the electron beam EB in a Y direction (the linear movement direction R of the rotating stage 14) and an X direction (the circumferential direction) orthogonal to the Y direction. The electron beam EB emitted from the electron gun 30 irradiates the resist on the substrate 12 via the electrostatic deflecting plates 32 and 34, a lens (not shown) condensing the electron beam, and so on.

A controller 36 controls driving of the spindle motor 18 (i.e., the rotation speed of the rotating stage 14), driving of the pulse motor 28 (i.e., linear movement by the linear moving device 24), ON/OFF of the electron beam EB from the electron gun 30, and deflection of the electron beam with the deflecting device having the electrostatic deflecting plates 32 and 34, thereby drawing desired patterns onto the resist on the substrate 12.

FIG. 8A is a plan view of the substrate 12 with desired patterns 38 (e.g., servo patterns for guiding a magnetic head onto a desired track) drawn thereon by the above-described electron beam lithography apparatus 1, and FIG. 8B is an enlarged view of a main part of FIG. 8A.

As shown in FIG. 8A, the patterns 38 including minute projections and depressions formed on a master carrier for magnetic transfer are arranged in a circular area excluding inner and outer peripheral portions of the substrate 12. These patterns 38 are formed in narrow-width regions extending in substantially radial directions from the center.

With part of a pattern 38 enlarged, as shown in FIG. 8B, an aggregation of minute elements 38a corresponding to information to be transferred constitutes concentric tracks T ($T_0, \ldots, T_i, \ldots$). When the recording method for the patterns 38 is of the type of a constant angular velocity of the rotating stage 14 (CAV), the circumferential length L of an element 38a is longer at the outer track $T_0$ and shorter at the inner track $T_i$ as shown in FIG. 8B as the sector length varies for the inner and outer peripheries. Inner elements 38a and outer elements 38a are arranged so that their start points align with a reference position of a rotation phase.

A basic aspect of a method for drawing an element 38a with the electron beam EB is as follows. As shown in FIG. 8B, while the substrate 12 is rotated in one direction A, the electron beam EB of a minute diameter scans in the circumferential direction X orthogonal to the radial direction (linear movement direction) R (Y) of the substrate 12 so that the shape of the element 38a is filled in, thereby drawing the rectangular element 38a at a predetermined phase position in a concentric track T (track width: W) extending microscopically linearly.

In this scanning, the electron beam EB is rapidly oscillated reciprocatively with a constant amplitude L in the circumferential direction X substantially orthogonal to the radial direction R (Y) while being deflected with a shift D in the radial direction R (Y). Thus, the electron beam EB sequentially draws the elements 38a by scanning them so that the shapes of the elements 38a are filled in with a triangular-wave trace. Once the electron beam EB finishes drawing for a lap of one track T, it moves to the next track T to draw in the same manner, thereby drawing the desired micropatterns 38 across the entire area of the substrate 12.

The track shift of the electron beam EB is performed by, for example, linearly moving the rotating stage 14 in the radial direction R (Y) for every n tracks (e.g., 16 tracks) corresponding to the maximum deflection range of the electron beam EB. The track-to-track shift within n tracks is performed by deflecting the electron beam EB.

When the electron gun 30 emitting the electron beam EB is of a fixed type, the rotating stage 14 is rotationally moved to shift the drawing trace during drawing of one rectangular element 38a. In this case, if the influence of the shifting is not negligible, it is necessary to deflect the electron beam EB with the shift D in the radial direction R (Y) while deflecting the oscillation center of reciprocative oscillation of the electron beam EB in the same direction as the rotation direction according to the rotation speed. Also, when the elements 38a of the patterns 38 are not rectangular but has a shape such as a parallelogram angled with respect to the track direction, it is necessary to deflect the electron beam EB with the shift D in the radial direction R (Y) while deflecting the oscillation center of reciprocative oscillation of the electron beam EB according to the angle.

SUMMARY OF THE INVENTION

In this type of electron beam lithography apparatus 1, it has been found that the linear movement direction R of the rotating stage 14 linearly moved by the linear moving device 24 and the direction of the electrostatic deflecting plates 32 (i.e., the deflection direction of the electron beam EB deflected by the electrostatic deflecting plates 32) Y are not aligned with each other but misaligned by about two degrees. This is due to a relative mounting error of the linear moving device 24 and the electrostatic deflecting plates 32 mounted on the apparatus, an axial deviation of the electrostatic deflecting plates 32, and so on.

Thus, as shown in FIG. 9, when the track shift of the electron beam EB for every n tracks is performed by moving the rotating stage 14 by a distance corresponding to n tracks in the linear movement direction R and the track-to-track shift of the electron beam EB within n tracks is performed by changing the deflection of the electron beam EB in the Y direction, displacements Δx occur in the patterns 38 drawn every n tracks due to the angle θ between the linear movement direction R and the Y direction of the electron beam EB. This deteriorates the accuracy in the smoothness of the patterns 38.

Similarly, as shown in FIG. 10, there is a problem that a rectangular element 38a to be drawn with its sides orthogonal or parallel to the linear movement direction R of the rotating stage 14 is drawn with rotation by the angle θ.

Furthermore, a mounting error of the electron gun 30, a lens, and the electrostatic deflecting plates 32 and 34 mounted on the apparatus, as well as an axial deviation, an optical distortion, and so on thereof prevent the electron beam EB from irradiating a desired position. For example, there is a problem that an element of a trapezoid, parallelogram, or other tetragons is drawn although drawing of a rectangular element is intended.

The present invention has been made in the light of the above circumstances. It is an object of the present invention to provide an electron beam lithography apparatus and a method for compensating for electron beam misalignment that are capable of compensating for drawing position misalignment of an electron beam due to a mechanical error, an optical axis deviation, an optical distortion, and so on and realizing highly precise drawing.

To accomplish the above object, a first aspect of the present invention is an electron beam lithography apparatus for drawing a desired pattern by irradiating resist applied to a substrate with an electron beam, including: a stage which supports the substrate; a stage driving device which moves the stage at least linearly; a first command device which outputs a first command signal for deflecting the electron beam in a linear movement direction of the stage; a signal processing device which processes the first command signal output from the first command device based on an angle between the linear movement direction of the stage driven by the stage driving device and a deflection direction of the electron beam deflected by the first command signal from the first command device so that the deflection direction of the electron beam aligns with the linear movement direction of the stage; a second command device which outputs a second command signal for causing the electron beam to draw an element included in a desired pattern which is set with reference to the linear movement direction of the stage driven by the stage driving device and a moving position of the electron beam deflected based on the first command signal; and a deflecting device which deflects the electron beam based on the first command signal processed by the signal processing device and the second command signal output from the second command device.

That is, the linear movement direction of the stage and the actual deflection direction of the electron beam deflected by the first command signal for deflecting the electron beam in the linear movement direction of the stage do not necessarily align with each other for reasons such as the disposition precision of the stage driving device, a lens system, and the deflecting device. Therefore, the first command signal output from the first command device is processed based on the angle between the linear movement direction of the stage driven by the stage driving device and the deflection direction of the electron beam deflected by the first command signal so that the deflection direction of the electron beam aligns with the linear movement direction of the stage. With this processed first command signal, the deflection direction of the electron beam can be changed (rotated) to align with the linear movement direction of the stage.

A second aspect of the present invention is an electron beam lithography apparatus for drawing a desired pattern by irradiating resist applied to a substrate with an electron beam, including: a stage which supports the substrate; a stage driving device which moves the stage at least linearly; a first command device which outputs a first command signal for deflecting the electron beam in a linear movement direction of the stage; a second command device which outputs a second command signal for causing the electron beam to draw an element included in a desired pattern which is set with reference to the linear movement direction of the stage driven by the stage driving device and a moving position of the electron beam deflected based on the first command signal; a compensating device which compensates for the second command signal output from the second command device for compensating for an error between an element actually drawn by the electron beam according to the second command signal from the second command device and the element included in the desired pattern; and a deflecting device which deflects the electron beam based on the first command signal output from the first command device and the second command signal compensated for by the compensating device.

That is, when the element (e.g., a rectangular element) included in the desired pattern is drawn so that the element is filled in with the electron beam, the second command signal for causing the electron beam to scan to fill in the element is output. However, the element actually filled in does not perfectly match the element included in the desired pattern for reasons such as a mechanical error and an optical distortion. Therefore, the compensating device compensates for the second command signal output from the second command device so that the actually drawn element matches the element included in the desired pattern. With this second command subjected to the compensation, the drawing position designated by the second command signal and the deflection position of the electron beam can be matched to precisely draw the element included in the desired pattern.

A third aspect of the present invention is an electron beam lithography apparatus for drawing a desired pattern by irradiating resist applied to a substrate with an electron beam, including: a stage which supports the substrate; a stage driving device which moves the stage at least linearly; a first command device which outputs a first command signal for deflecting the electron beam in a linear movement direction of the stage; a signal processing device which processes the first command signal output from the first command device based on an angle between the linear movement direction of the stage driven by the stage driving device and a deflection direction of the electron beam deflected by the first command signal from the first command device so that the deflection direction of the electron beam aligns with the linear movement direction of the stage; a second command device which outputs a second command signal for causing the electron beam to draw an element included in a desired pattern which is set with reference to the linear movement direction of the stage driven by the stage driving device and a moving position of the electron beam deflected based on the first command signal; a compensating device which compensates for the second command signal output from the second command device for compensating for an error between an element actually drawn by the electron beam according to the second command signal from the second command device and the element included in the desired pattern; and a deflecting device which deflects the electron beam based on the first command signal processed by the signal processing device and the second command signal compensated for by the compensating device.

The third aspect of the present invention includes the features of both the first and second aspects of the present invention.

As indicated in a fourth aspect of the present invention, in the electron beam lithography apparatus according to the second or third aspect, the compensating device has a conversion table storing a converted value for each command signal of the second command device for compensating for the command signal, and reads out from the conversion table a converted value corresponding to the command signal from the second command device and outputs the converted value. This enables correction even when correction by using gain or offset adjustment is impossible because of a nonlinear relationship between the drawing position designated by the second command signal output from the second command device and the deflection position of the electron beam deflected based on the second command signal.

As indicated in a fifth aspect of the present invention, in the electron beam lithography apparatus according to any of the first to fourth aspects, the angle between the linear movement direction of the stage driven by the stage driving device and the deflection direction of the electron beam deflected by the first command signal from the first command device is not greater than three degrees.

This is because the apparatus in practice has misalignment of about two degrees, or three degrees at the maximum.

As indicated in a sixth aspect of the present invention, in the electron beam lithography apparatus according to any of the first to fifth aspects, the deflecting device can shift the electron beam by not less than ±5 μm on the resist on the substrate. Therefore, for example, the electron beam can be shifted across the range of not less than ±5 μm in the same direction as the linear movement direction of the stage.

As indicated in a seventh aspect of the present invention, in the electron beam lithography apparatus according to any of the first to sixth aspects, the deflecting device can oscillate the electron beam with a responsivity of not less than 10 MHz. Therefore, the deflecting device can cause the electron beam to scan (oscillate) at a high speed when the element included in the desired pattern is drawn by scanning so that it is filled in with the electron beam.

An eighth aspect of the present invention is a method for compensating for misalignment of an electron beam in the electron beam lithography apparatus according to the first or third aspect, including the steps of: linearly moving the stage with the stage driving device and drawing a marker with the electron beam on a linear movement path of the stage; outputting a first command signal for deflecting the electron beam in a linear movement direction of the stage from the first command device and drawing a marker with the electron beam on a movement path of the electron beam; and measuring an angle between the linear movement direction of the stage and a deflection direction of the electron beam deflected by the command signal from the first command device based on the two drawn markers, wherein the signal processing device processes the first command signal output from the first command device based on the measured angle so that the deflection direction of the electron beam aligns with the linear movement direction of the stage.

That is, by linearly moving the stage with the stage driving device and drawing a marker with the electron beam on the linear movement path of the stage, the linear movement direction of the stage can be determined from the drawn marker. Similarly, by outputting the first command signal for deflecting the electron beam in the linear movement direction of the stage from the first command device and drawing a marker with the electron beam on the movement path of the electron beam, the deflection direction of the electron beam based on the first command signal can be determined from the drawn marker. Therefore, the angle between the linear movement direction of the stage and the deflection direction of the electron beam can be measured. The signal processing device processes the first command signal output from the first command device based on the measured angle so that the deflection direction of the electron beam aligns with the linear movement direction of the stage. That is, a signal component for deflecting the electron beam also in the direction orthogonal to the linear movement direction of the stage can be added to the first command signal to change (rotate) the deflection direction of the electron beam by the measured angle.

A ninth aspect of the present invention is a method for compensating for misalignment of an electron beam in the electron beam lithography apparatus according to the second or third aspect, including the steps of: linearly moving the stage with the stage driving device and drawing two or more markers including a reference marker with the electron beam on a linear movement path of the stage; outputting a predetermined command signal from the second command device for drawing with the electron beam a predetermined pattern with reference to a linear movement direction of the stage driven by the stage driving device and a position of the reference marker; measuring the linear movement direction of the stage based on positions of the two or more drawn markers and measuring the drawn predetermined pattern; and calculating, based on the measured linear movement direction of the stage and the measured predetermined pattern, an error between the predetermined pattern drawn with reference to the linear movement direction of the stage and the position of the reference marker and the predetermined pattern to be drawn according to the predetermined command signal, and obtaining compensation information for compensating for the command signal output from the first command device based on the calculated error, wherein the compensating device compensates for the command signal output from the second command device based on the compensation information and outputs the compensated command signal.

That is, by linearly moving the stage with the stage driving device and drawing two or more markers including the reference marker with the electron beam on the linear movement path of the stage, the linear movement direction of the stage can be determined from positions of the two or more drawn markers. Then, a predetermined command signal is output from the second command device for drawing with the electron beam the predetermined pattern (e.g., a rectangular pattern or a grid pattern) with reference to the position of the reference marker (origin) and the determined linear movement direction. The predetermined pattern actually drawn based on the predetermined command signal is measured with reference to the position of the reference marker (origin) and the linear movement direction, an error (misalignment) between the actually drawn predetermined pattern and the predetermined pattern to be drawn according to the predetermined command signal is calculated, and compensation information is obtained for compensating for a command signal output from the first command device based on the calculated error. Based on the compensation information obtained in this manner, the compensating device can compensate for the command signal output from the second command device, thereby matching the drawing position designated by the second command signal subjected to the compensation and the deflection position of the electron beam.

According to the present invention, drawing position misalignment of the electron beam due to a mechanical error, an optical axis deviation, an optical distortion, and so on of the electron beam lithography apparatus can be electrically compensated for to realize highly precise drawing.

DETAILED DESCRIPTION OF THE PREFERRED EMBODIMENTS

Now, a preferred embodiment of an electron beam lithography apparatus and a method for compensating for electron beam misalignment according to the present invention will be described below with reference to the attached drawings.

<Electron Beam Lithography Apparatus>

Figure 1A:
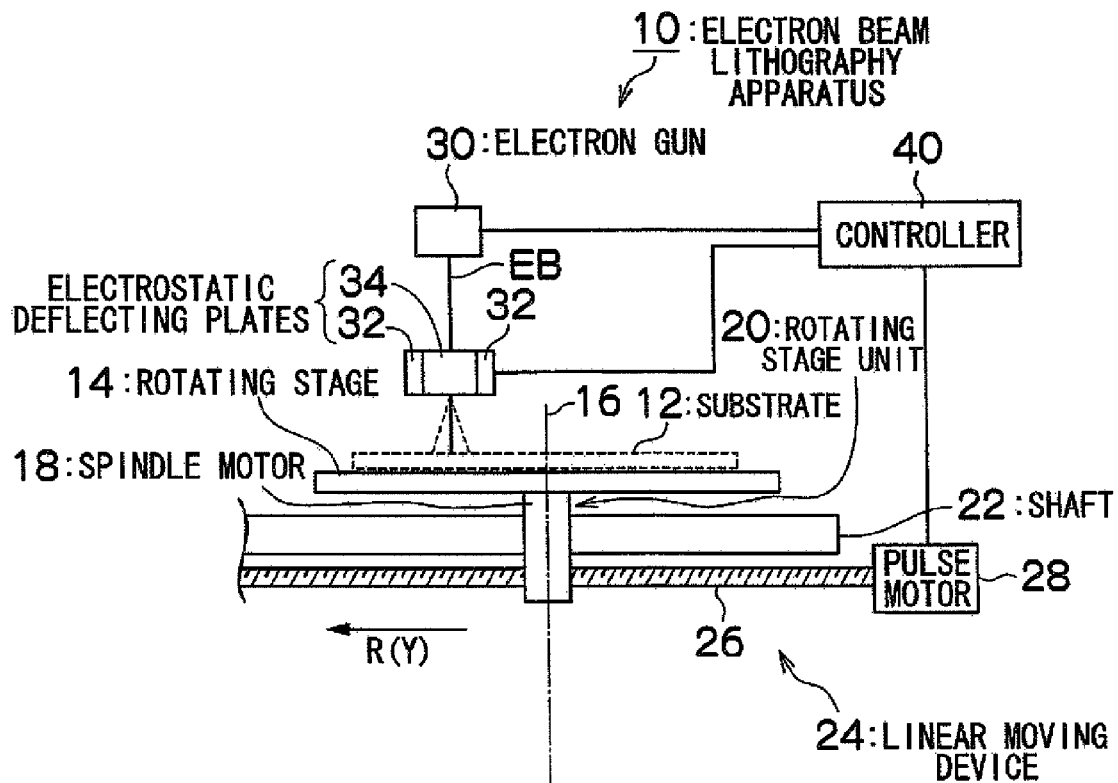
FIGS. 1A and 1B are a side view and a plan view of main parts showing an embodiment of an electron beam lithography apparatus according to the present invention respectively.
Figure 1B:
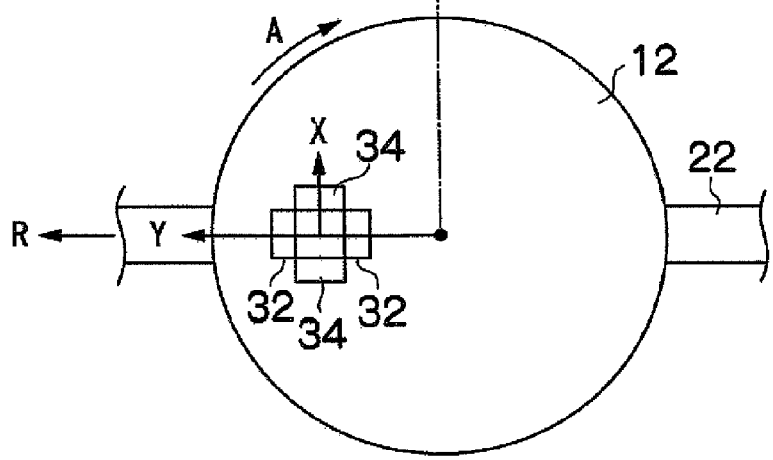

FIGS. 1A and 1B are a side view and a plan view of main parts showing an embodiment of the electron beam lithography apparatus according to the present invention respectively. Elements common to the conventional electron beam lithography apparatus 1 shown in FIGS. 7A and 7B are given like symbols and will not be described in detail.

Figure 7A:
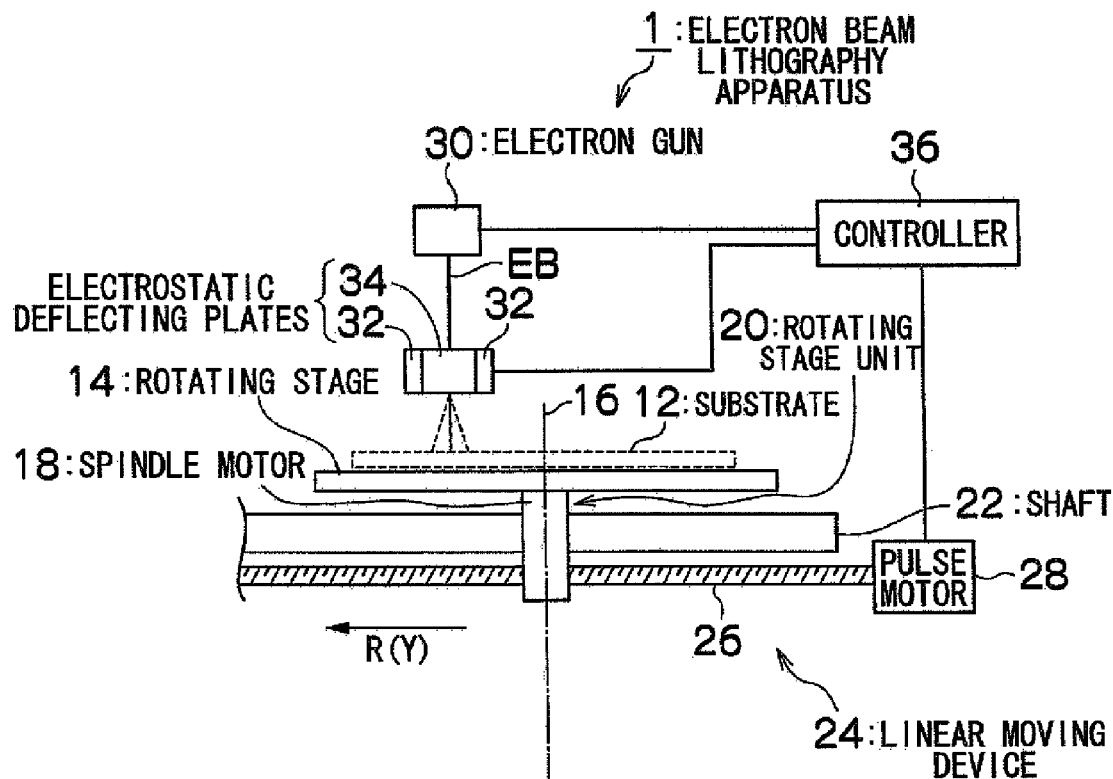
FIGS. 7A and 7B are a side view and a plan view of main parts showing an embodiment of a conventional electron beam lithography apparatus respectively.
Figure 7B:
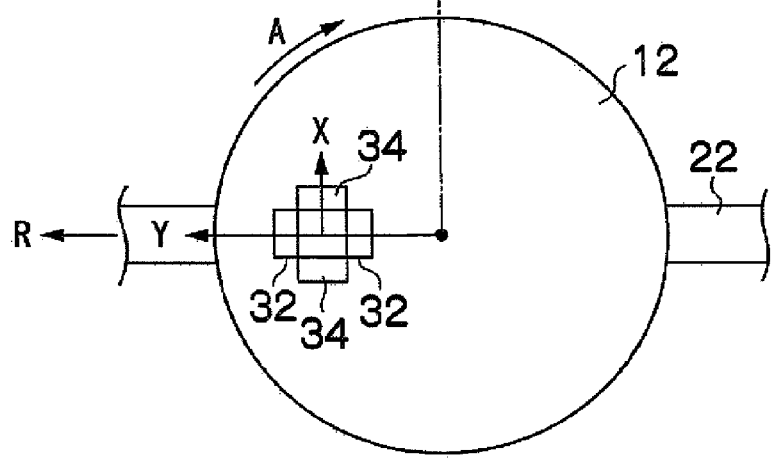

The electron beam lithography apparatus 10 shown in FIGS. 1A and 1B differs from the electron beam lithography apparatus 1 shown in FIGS. 7A and 7B mainly in that a controller 40 is provided in place of the controller 36.

In FIGS. 1A and 1B, the deflecting device has the electrostatic deflecting plates 32 and 34. The electrostatic deflecting plates 32 are provided to deflect the electron beam EB in the Y direction (the same direction as the linear movement direction R of the rotating stage 14), and the electrostatic deflecting plates 34 are provided to deflect the electron beam EB in the X direction orthogonal to the Y direction.

However, the deflection direction Y of the electron beam EB actually deflected when a voltage is applied to the electrostatic deflecting plates 32 of the deflecting device and the linear movement direction R of the rotating stage 14 moved by the linear moving device 24 are not perfectly aligned with each other but misaligned within the range of three degrees.

Figure 2:
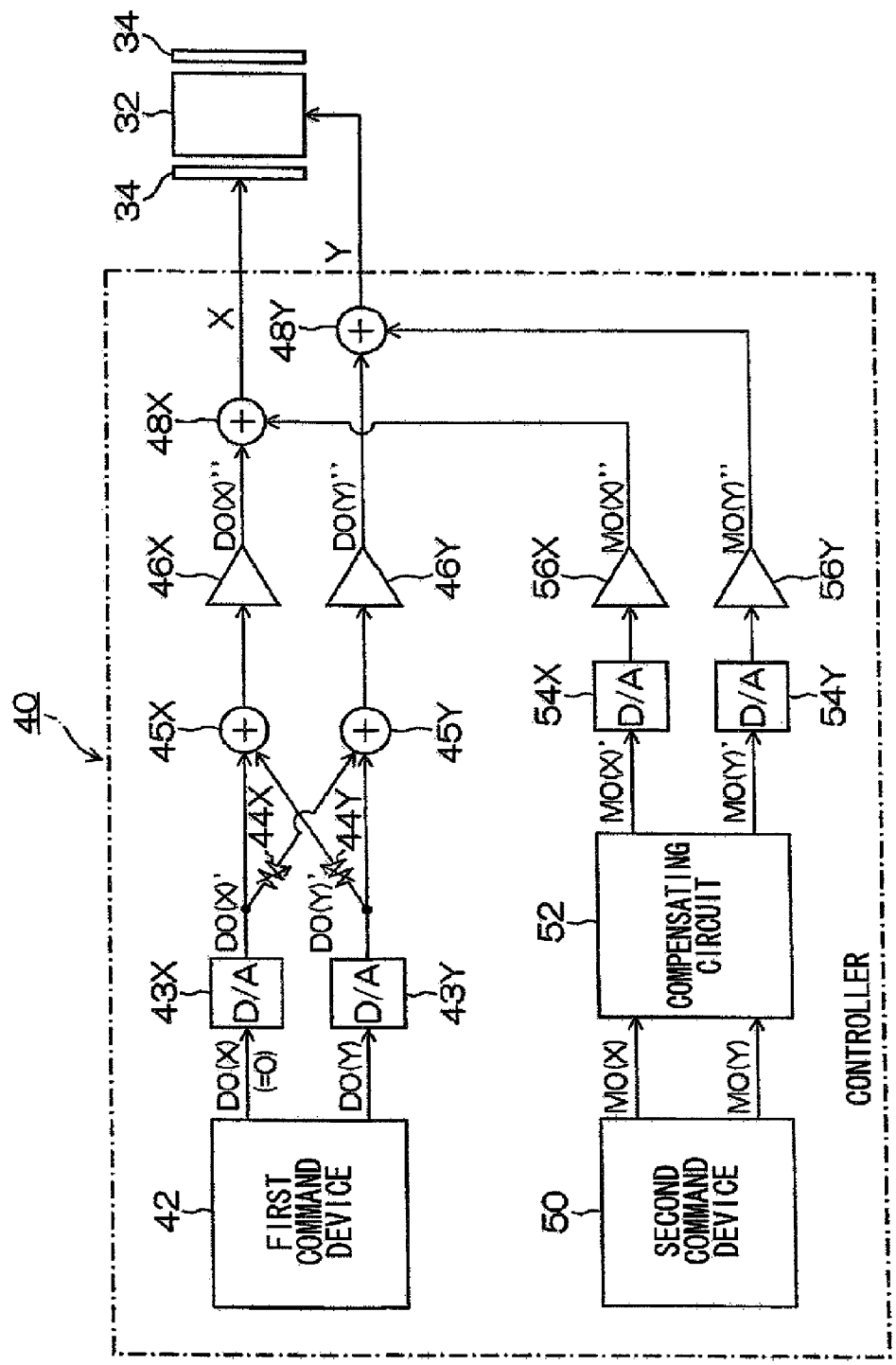
FIG. 2 is a diagram showing an internal configuration of main parts of a controller shown in FIGS. 1.

FIG. 2 is a diagram showing an internal configuration of main parts of the controller 40 shown in FIGS. 1A and 1B, and in particular, a control unit for controlling deflection of the electron beam EB by controlling voltages applied to the electrostatic deflecting plates 32 and 34.

In FIG. 2, a first command device 42 outputs first command signals DO(X) (=0) and DO(Y) for deflecting the electron beam EB in the Y direction and causing the electron beam EB to move track to track. That is, while a desired pattern to be drawn on the resist on the substrate 12 is drawn track by track, for each movement of the electron beam EB to the next track, the first command signals DO(X) and DO(Y) corresponding to that track position are output.

In this embodiment, once drawing for every n tracks (e.g., 16 tracks) is finished, the linear moving device 24 moves the rotating stage 14 by a distance corresponding to n tracks in the linear movement direction R. Therefore, the first command device 42 outputs the same first command signals DO(X) and DO(Y) every n tracks.

The first command signals DO(X) and DO(Y) are converted by D/A converters 43X and 43Y into analog signals DO(X)' and DO(Y)' respectively. The analog signal DO(X)' converted by the D/A converter 43X is output to an adder 45Y via a variable resistor 44X and also output to an adder 45X. The analog signal DO(Y)' converted by the D/A converter 43Y is output to the adder 45X via a variable resistor 44Y and also output to the adder 45Y.

The adder 45X includes, for example, an operational amplifier having a feedback resistor. The adder 45X adds up the input analog signal DO(X)' and the input analog signal DO(Y)' divided into appropriate voltages by the variable resistor 44Y and the feedback resistor, and outputs the resulting analog signal to a deflection amplifier 46X. Similarly, the adder 45Y adds up the input analog signal DO(Y)' and the input analog signal DO(X)' divided into appropriate voltages by the variable resistor 44X and a feedback resistor, and outputs the resulting analog signal to a deflection amplifier 46Y.

The deflection amplifiers 46X and 46Y adjust the sensitivity for the input analog signals and output the sensitivity-adjusted first command signals DO(X)" and DO(Y)" to adders 48X and 48Y respectively.

Here, description will be given of operation of the aforementioned variable resistors 44X and 44Y, adders 45X and 45Y, and deflection amplifiers 46X and 46Y.

Figure 9:
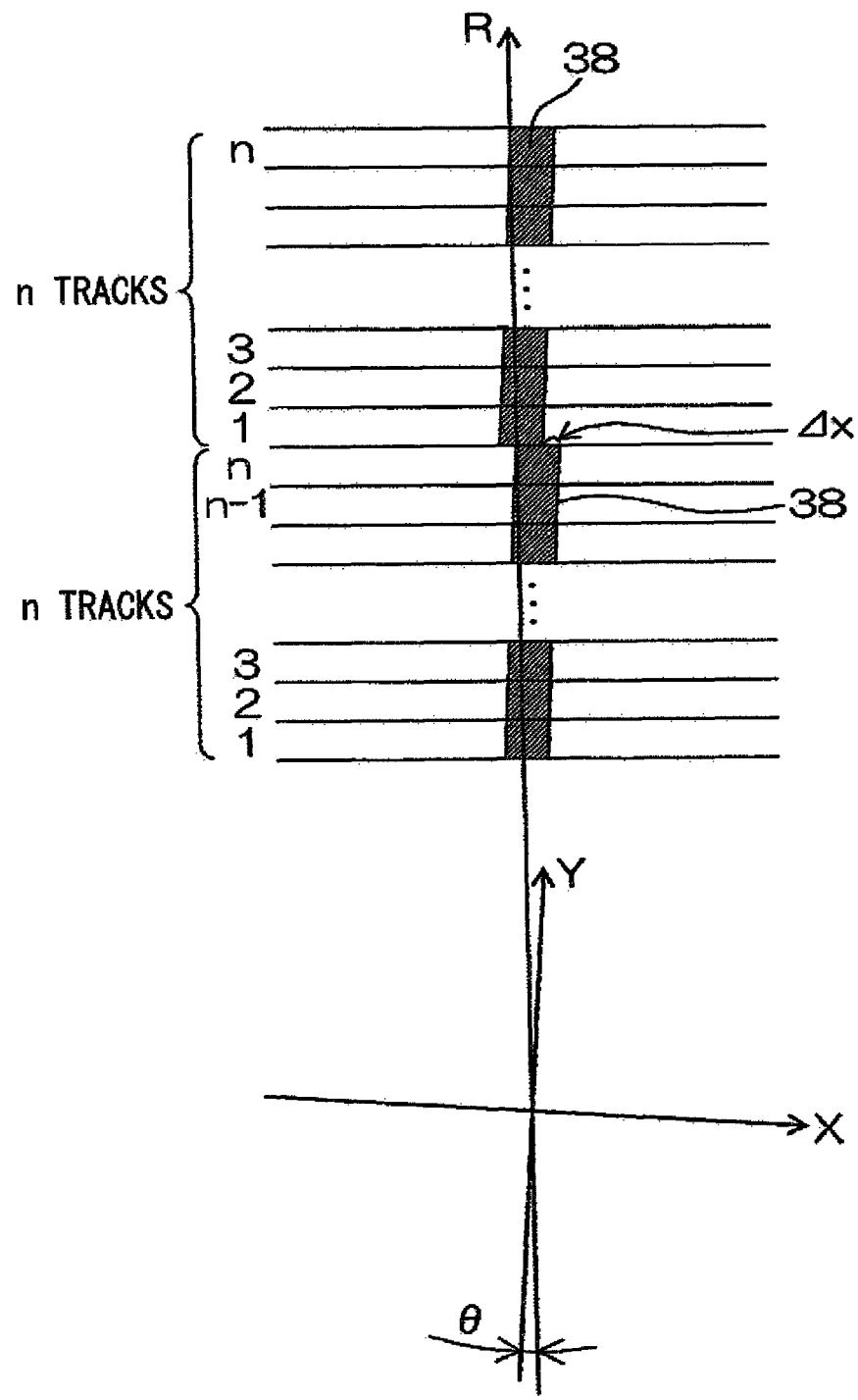
FIG. 9 is a diagram showing an exemplary defective pattern drawn by the conventional electron beam lithography apparatus.
Figure 10:
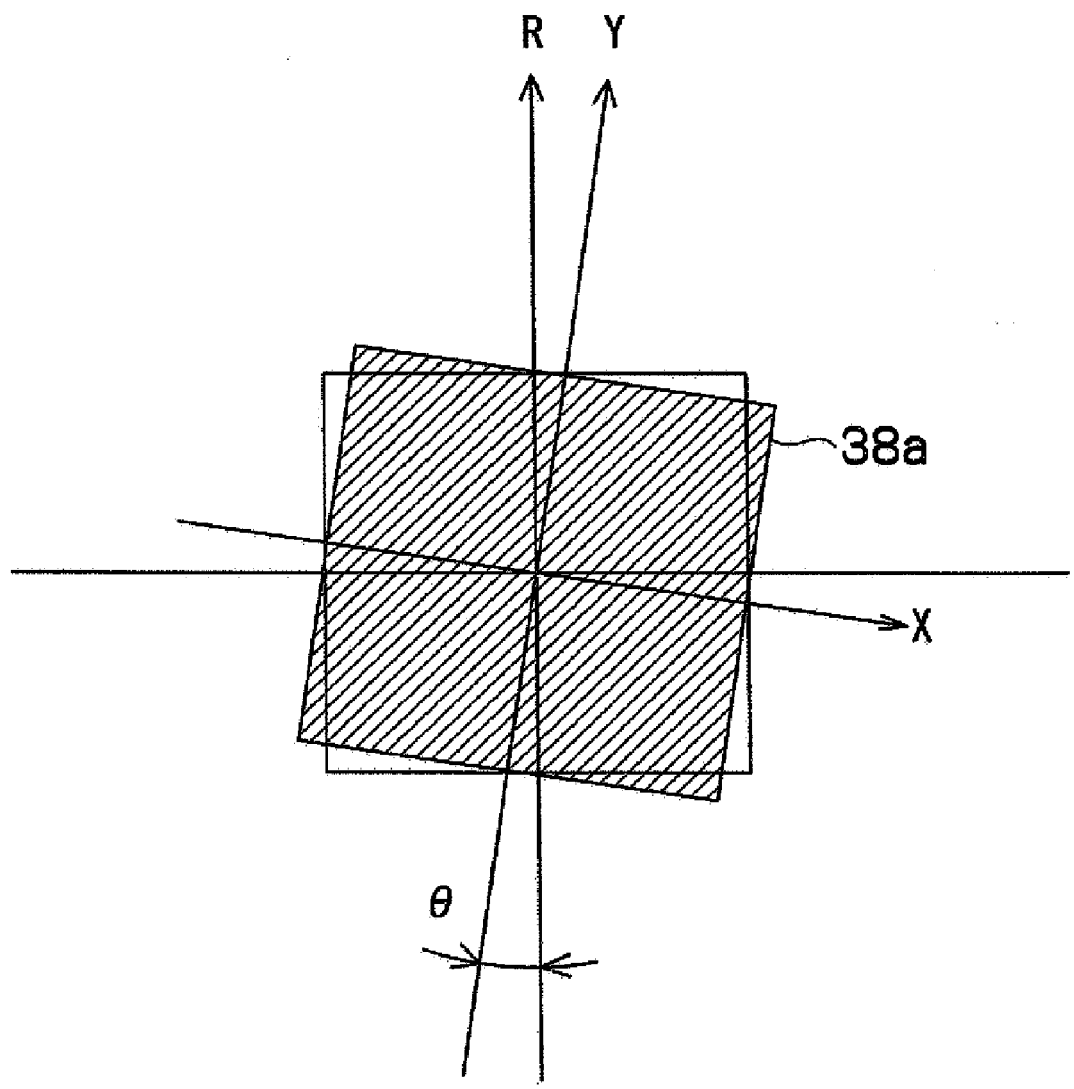
FIG. 10 is a diagram showing an exemplary defective element included in a pattern drawn by the conventional electron beam lithography apparatus.

As shown in FIG. 9, given the angle θ between the deflection direction Y of the electron beam EB actually deflected when a voltage is applied to the electrostatic deflecting plates 32 of the deflecting device and the linear movement direction R of the rotating stage 14 moved by the linear moving device 24, the deflection direction Y of the electron beam EB needs to be rotated by the angle θ in order to align the deflection direction Y of the electron beam EB with the linear movement direction R.

Therefore, for rotating the electron beam EB by the angle θ, the first command signal DO(X)" in the X direction is also output in addition to the fist command signal DO(Y)" in the Y direction.

The output signals DO(X)' and DO(Y)' from the D/A converters 43X and 43Y are output as the signals DO(X)" and DO(Y)" from the deflection amplifiers 46X and 46Y through the operation of the variable resistors 44X and 44Y, the adders 45X and 45Y, and the deflection amplifiers 46X and 46Y. Given the angle θ between the linear movement direction R and the deflection direction Y of the electron beam EB, the relationship between the signals DO(X)' and DO(Y)' and the signals DO(X)" and DO(Y)" can be expressed as the following equation.

$$\begin{pmatrix} DO(X)'' \\ DO(Y)'' \end{pmatrix} = \begin{pmatrix} K1 & K2 \\ K3 & K4 \end{pmatrix} \begin{pmatrix} \cos\theta & -\sin\theta \\ \sin\theta & \cos\theta \end{pmatrix} \begin{pmatrix} DO(X)' \\ DO(Y)' \end{pmatrix}$$ [Formula 1]

In the above equation [Formula 1], the first term and the second term in the right side are a scaling term and a rotation term respectively and are each constants. The variable resistors 44X and 44Y, the adders 45X and 45Y, and the deflection amplifiers 46X and 46Y perform the analog processing of the above equation [Formula 1].

Since DO(X)'=0 in this embodiment, the above equation [Formula 1] can be rewritten as the following equations.

$$DO(X)''=-K1 \cdot \sin\theta \cdot DO(Y)'$$

$$DO(Y)''=K4 \cdot \cos\theta \cdot DO(Y)'$$ [Formula 1]'

A circuit for performing the analog processing of these equations [Formula 1]' can be simplified compared to the above-described variable resistors 44X and 44Y, adders 45X and 45Y, and deflection amplifiers 46X and 46Y.

Figure 8A:
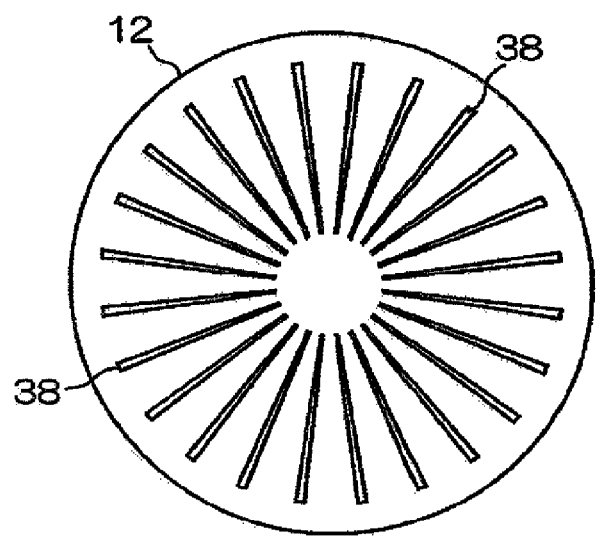
FIG. 8A is a plan view of a substrate with desired patterns drawn thereon by the electron beam lithography apparatus.
Figure 8B:
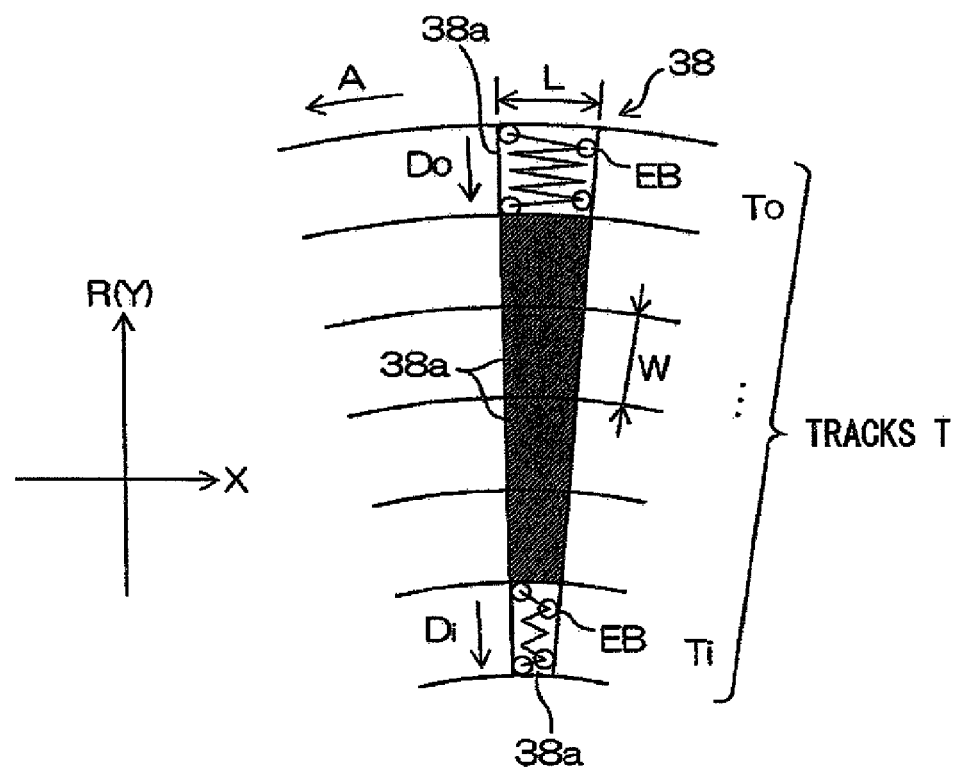
FIG. 8B is an enlarged view of a main part of FIG. 8A.

On the other hand, a second command device 50 outputs second command signals MO(X) and MO(Y) for causing the electron beam EB to scan so that the shape of an element 38a is filled in with a triangular-wave trace as shown in FIG. 8B. These second command signals MO(X) and MO(Y) are supplied to a compensating circuit 52.

The compensating circuit 52 compensates for misalignment between the scanning position of the electron beam EB designated by the second command signals MO(X) and MO(Y) and the scanning position of the electron beam EB actually irradiating the resist on the substrate 12. A conversion table (e.g., a two-dimensional lookup table) storing second command signals MO(X)' and MO(Y)' for compensating for the second command signals MO(X) and MO(Y) is provided in the compensating circuit 52. The compensating circuit 52 reads the second command signals MO(X)' and MO(Y)' as converted values uniquely determined for the input second command signals MO(X) and MO(Y) from the conversion table and outputs these second command signals MO(X)' and MO(Y)' to D/A converters 54X and 54Y respectively. Details of the converted values stored in the conversion table of the compensating circuit 52 will be described later.

The D/A converters 54X and 54Y convert the input digital second command signals MO(X)' and MO(Y)' into analog signals and output them to deflection amplifiers 56X and 56Y respectively. The deflection amplifier 56X adjusts the sensitivity for the input analog signal according to a predetermined gain value and adds the sensitivity-adjusted second command signal MO(X)" to the other input of the adder 48X. Similarly, the deflection amplifier 56Y adjusts the sensitivity for the input analog signal according to a predetermined gain value and adds the sensitivity-adjusted second command signal MO(Y)" to the other input of the adder 48Y.

The adder 48X adds up the first command signal DO(X)" input from the deflection amplifier 46X and the second command signal MO(X)" input from the deflection amplifier 56X and applies the resulting signal (voltage signal) X to the electrostatic deflecting plates 34 of the deflecting device. The adder 48Y adds up the first command signal DO(Y)" input from the deflection amplifier 46Y and the second command signal MO(Y)" input from the deflection amplifier 56Y and applies the resulting signal (voltage signal) Y to the electrostatic deflecting plates 32 of the deflecting device.

The deflecting device, having the voltage signals X and Y applied to the electrostatic deflecting plates 32 and 34 respectively, deflects the electron beam EB emitted from the electron gun 30 to irradiate the resist of the substrate 12 via the lens system. Thus, the deflecting device causes the electron beam EB to draw a desired pattern.

A driving unit used for the deflecting device including the deflection amplifiers 46X and 46Y is one capable of shifting the electron beam EB by not less than ±5 μm on the resist on the substrate 12. In this electron beam lithography apparatus 10, a driving unit capable of deflecting the electron beam EB at the amplitude of ±10 μm with the responsivity of about 0.1 MHz is used.

A driving unit used for the deflecting device including the deflection amplifiers 56X and 56Y is high-speed deflection amplifiers capable of causing the oscillation (scan) of the electron beam EB at a high speed not less than 10 MHz. In this electron beam lithography apparatus 10, deflection amplifiers capable of oscillating at the amplitude of ±1 μm with the responsivity of 30 MHz are used.

<Method for Compensating for Electron Beam Misalignment>

Now, description will be given of the method for compensating for electron beam misalignment in the electron beam lithography apparatus 10 according to the present invention.

[Compensation for Misalignment Between Linear Movement Direction R of Rotating Stage 14 and Y Direction of Electron Beam EB]

Figure 3:
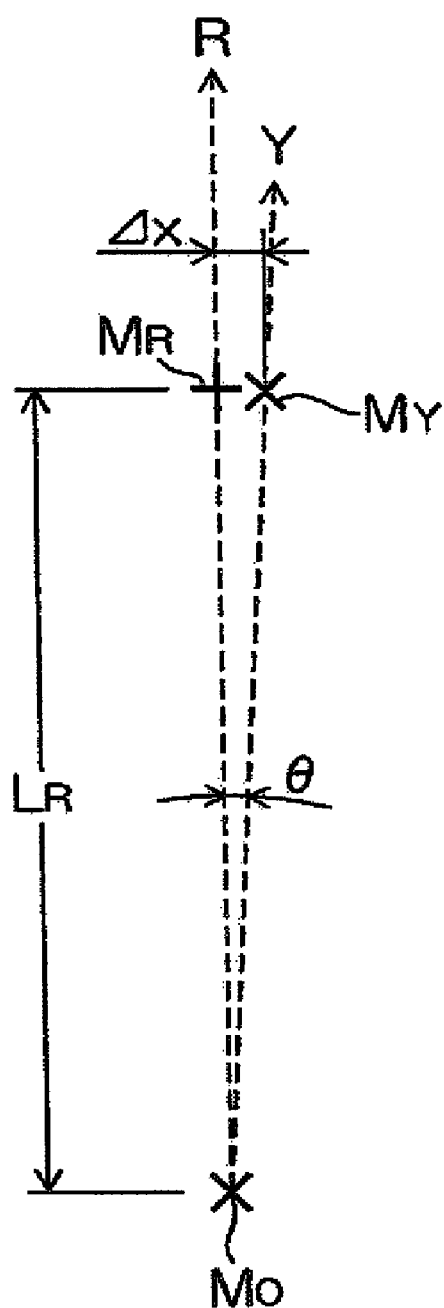
FIG. 3 is a diagram used to illustrate compensation for misalignment between a linear movement direction R of a rotating stage and a Y direction of an electron beam EB.

As shown in FIG. 3, three markers $M_O$, $M_Y$, and $M_R$ are drawn with the electron beam EB on the resist on the substrate 12.

Figure 4:
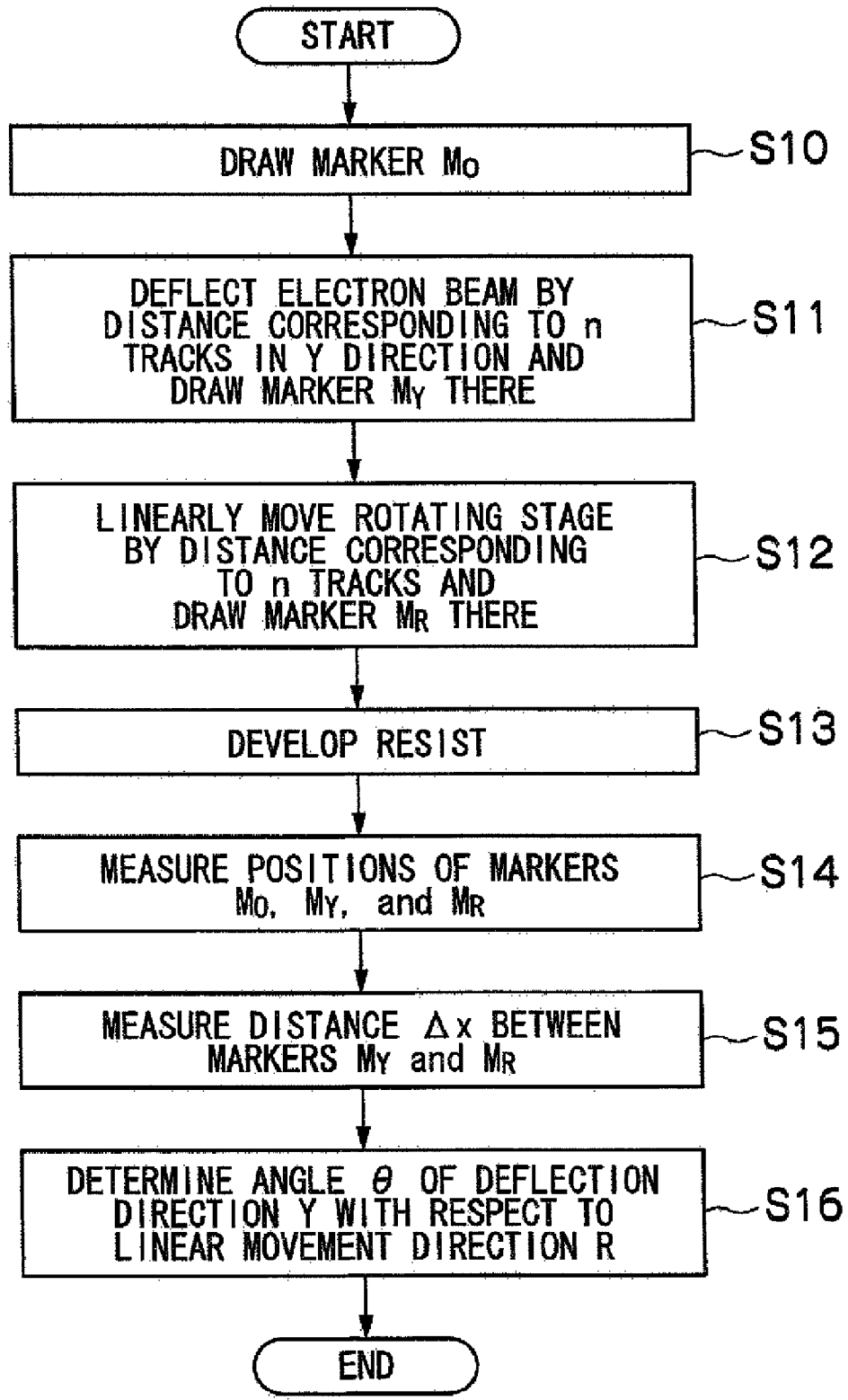
FIG. 4 is a flowchart showing a procedure for determining an angle between the linear movement direction R of the rotating stage and the Y direction of the electron beam EB.

First, as shown in a flowchart of FIG. 4, the marker $M_O$ as a reference is drawn with the electron beam EB on the resist on the substrate 12 (step S10). This drawing is performed by changing the second command signals MO(X) and MO(Y) from the second command device 50.

Next, the first command signal DO(Y) output from the first command device 42 is changed so that the electron beam EB is moved by the distance corresponding to n tracks in the Y direction. There, the second command signals MO(X) and MO(Y) from the second command device 50 are changed to draw the marker $M_Y$ (step S11).

Next, the first command signal DO(Y) is set to the same value as in the drawing of the marker $M_O$. The rotating stage 14 is moved with the linear moving device 24 by the distance corresponding to n tracks in the linear movement direction R. There, the second command signals MO(X) and MO(Y) from the second command device 50 are changed to draw the marker $M_R$ (step S12).

In FIG. 3, the markers $M_Y$ and $M_R$ each have different shapes for discrimination between them, that is, "×" for the marker $M_Y$ and "+" for the marker $M_R$.

The resist on the substrate with the above three markers $M_O$, $M_Y$, and $M_R$ drawn thereon is developed (step S13). The position of each of the markers $M_O$, $M_Y$, and $M_R$ made recognizable by the development is measured (step S14). As shown in FIG. 3, the distance Δx between the marker $M_R$ and the marker $M_Y$ in the direction orthogonal to the linear movement direction R of the rotating stage 14 is measured (step S15).

Based on this distance Δx and the distance $L_R$ between the markers $M_O$ and $M_R$, the angle θ between the linear movement direction R of the rotating stage 14 and the deflection direction Y of the electron beam EB according to the first command signal DO(Y) is determined by the following equations (step S16).

$$\tan\theta = \Delta x / L_R$$

$$\theta = \tan^{-1}(\Delta x / L_R) \quad \text{[Formula 2]}$$

Based on the angle θ measured in this manner, the second term (rotation term) in the right side of the above-described equation [Formula 1] can be determined.

Since the angle θ is a small angle not greater than three degrees, sin θ may be set to $\Delta x/L_R$ and cos θ may be set to 1.

In FIG. 3, since the distance $L_R$ between the markers $M_O$ and $M_R$ (the width of n tracks) is known, only the markers $M_R$ and $M_Y$ may be drawn and only the distance Δx between these markers $M_R$ and $M_Y$ may be measured to determine the angle θ. Alternatively, the patterns shown in FIG. 9 may be drawn and the displacement Δx in the patterns 38 drawn every n tracks may be measured to determine the angle θ.

[Compensation for Scanning Position Misalignment of Electron Beam EB Scanning at High Speed]

Figure 5:
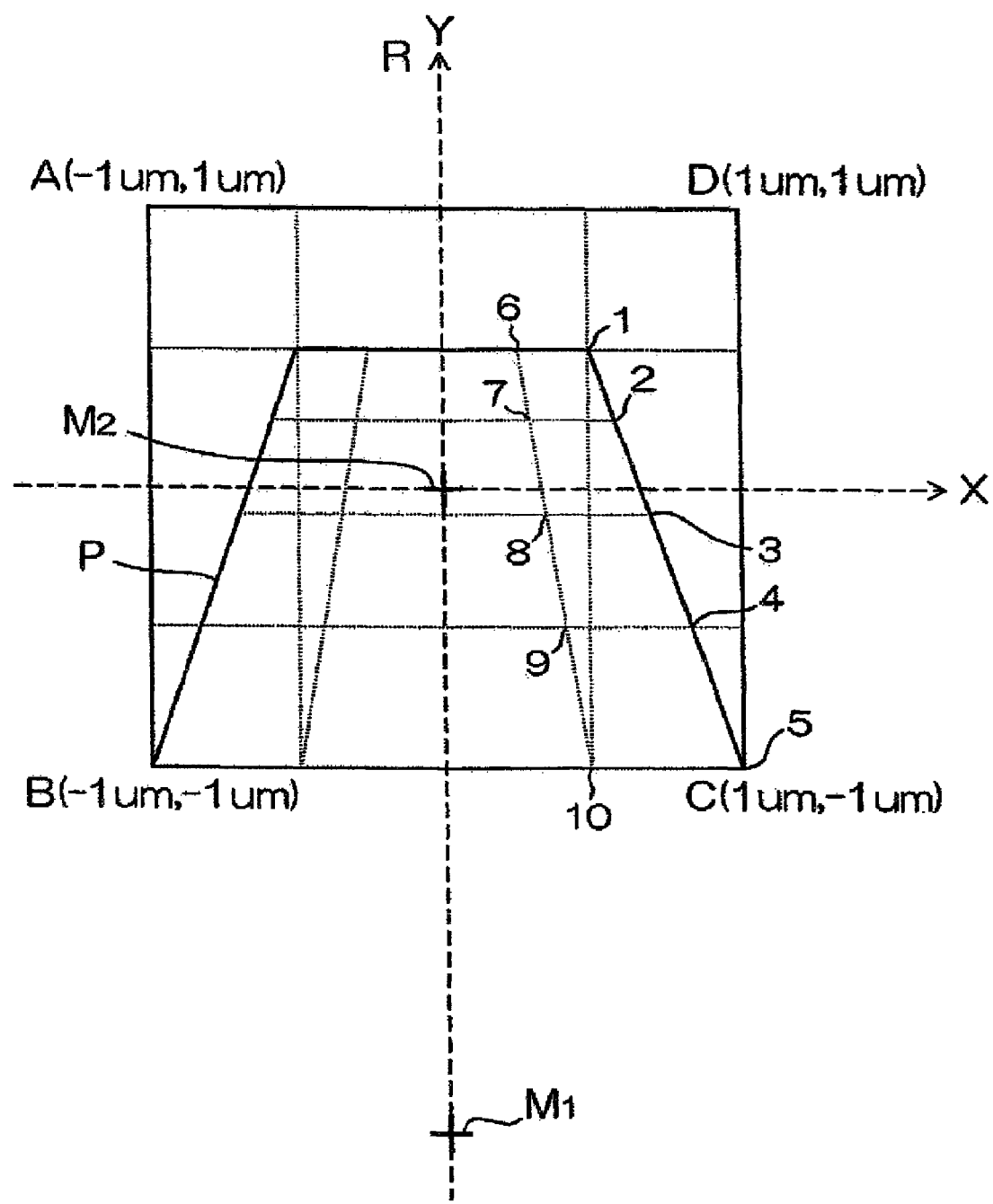
FIG. 5 is a diagram used to illustrate compensation for scanning position misalignment of the electron beam EB scanning at a high speed.

As shown in FIG. 5, two markers $M_1$ and $M_2$ are drawn with the electron beam EB on the resist on the substrate 12, and a predetermined pattern P is drawn with the electron beam EB.

Figure 6:
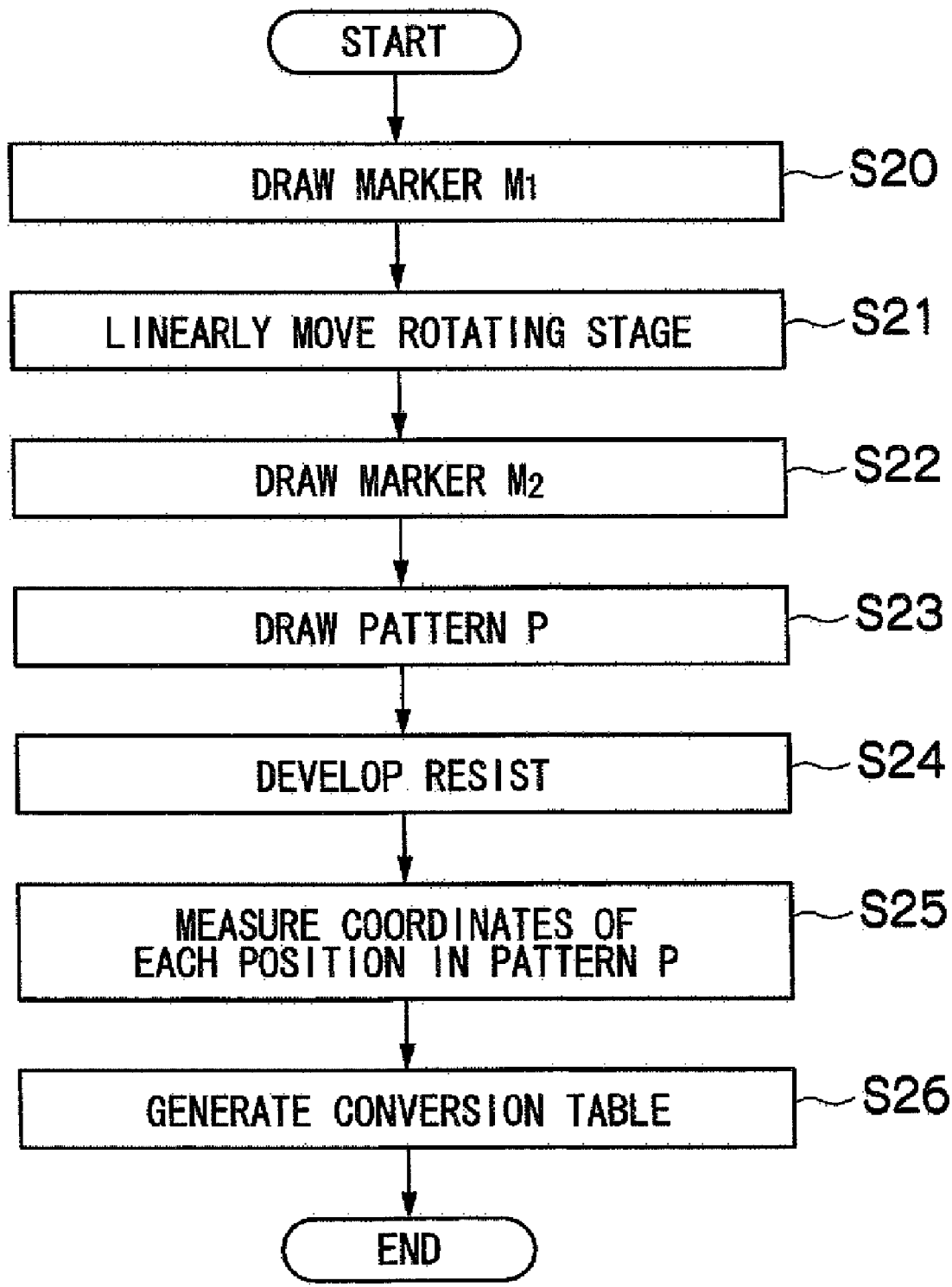
FIG. 6 is a flowchart showing a procedure for obtaining a conversion table for converting a command signal so that a scanning position of the electron beam is shifted to a desired position.

First, as shown in a flowchart in FIG. 6, the marker $M_1$ is drawn with the electron beam EB (step S20). Next, the rotating stage 14 is moved with the linear moving device 24 by a predetermined distance in the linear movement direction R (step S21), where the marker $M_2$ is drawn with the electron beam EB (step S22). The drawing of the markers at each target position is performed by changing the second command signals MO(X) and MO(Y) from the second command device 50.

Next, as shown in FIG. 5, using the position of the marker $M_2$ as a reference (origin), the second command signals MO(X) and MO(Y) for drawing a rectangular pattern passing through four points A (−1 μm, 1 μm), B (−1 μm, −1 μm), C (1 μm, −1 μm), and D (1 μm, 1 μm) are output from the second command device 50 to draw the pattern P (step S23).

If the apparatus were operating exactly according to its specifications, input of a rated analog signal would deflect the electron beam EB to a position corresponding to the analog signal. For the electron beam EB in this embodiment, a deflection position at ±1 μm corresponds to ±1 V.

However, for reasons such as the misalignment between the linear movement direction R and the deflection direction Y of the electron beam EB and an optical distortion of the electron beam EB, the pattern P is not drawn as designated but is tilted or distorted with respect to the linear movement direction R of the rotating stage 14.

The resist on the substrate with the above markers $M_1$ and $M_2$ and the pattern P drawn thereon is developed (step S24). The position of each of the markers $M_1$ and $M_2$ and the pattern P made recognizable by the development is measured. The coordinates of the four corners of the pattern P are measured in an orthogonal coordinate system in which the direction of a line connecting the markers $M_1$ and $M_2$ (the linear movement direction R of the rotating stage 14) is one direction of the orthogonal coordinate system and the position of the marker $M_2$ is the origin (step S25). Based on the positions of the measured four corners, the positions of points in the pattern P are determined by techniques such as interpolation. In FIG. 5, for simplicity of illustration, the coordinates of each intersection in the 2 μm×2 μm square divided into 4×4 blocks are determined.

If the pattern P were drawn exactly according to the specifications, applying Vx=0.5 V and Vy=0.5 V to the electrostatic deflecting plates 34 and 32 would deflect the electron beam EB to irradiate a position (0.5 μm, 0.5 μm). However, according to the pattern P shown in FIG. 5, the electron beam EB is deflected only to a position 7 (about 0.25 μm, about 0.3 μm). For the electron beam EB to be deflected to the desired position (0.5 μm, 0.5 μm), it must be deflected to a position 1. Applied voltages corresponding to the position 1 are Vx'=1V and Vy'=1V.

In step S26, a conversion table is generated that converts the second command signals MO(X) and MO(Y) into the second command signals MO(X)' and MO(Y)' so that each position in the pattern P is shifted to a desired position. The conversion table generated in this manner is set in the compensating circuit 52 in FIG. 2.

If the applied voltages (Vx' and Vy') were to be determined by the following conversion equation that performs simple scaling, $$\begin{bmatrix} Vx' \\ Vy' \end{bmatrix} = \begin{bmatrix} Kx & 0 \\ 0 & Ky \end{bmatrix} \begin{bmatrix} Vx \\ Vy \end{bmatrix} \quad \text{[Formula 3]}$$

then Kx=2 and Ky=2 in the case of the above example. However, desired oscillation of the electron beam EB corresponding to a servo signal is not merely unidirectional but two-dimensional, and also varies in the scaling factor depending on the oscillation direction. Therefore, the required applied voltages (Vx' and Vy') cannot be calculated by the above equation [Formula 3]. For this reason, the conversion table is used as described above.

In practice, for the 2 μm×2 μm square, the coordinates of each intersection in the square divided into 10 bits (1024)×10 bits (about 2-nm blocks) are determined. The conversion table stores a converted value for each intersection. Thus, the deflection position of the electron beam EB is compensated for with a position precision not greater than 2 nm.

It is to be noted that the patterns drawn on the resist on the substrate is not limited to those illustrated in this embodiment, and that the deflecting device is not limited to the one having two pairs of (four) electrostatic deflecting plates.

What is claimed is:

1. An electron beam lithography apparatus for drawing a desired pattern by irradiating resist applied to a substrate with an electron beam, comprising:
    a rotating stage which supports the substrate;
    a stage driving device which moves the rotating stage linearly in one direction only;
    a first command device which outputs a first command signal for deflecting the electron beam in a linear movement direction of the rotating stage;
    a signal processing device which processes the first command signal output from the first command device based on an angle between the linear movement direction of the rotating stage driven by the stage driving device and a deflection direction of the electron beam deflected by the first command signal from the first command device so that the deflection direction of the electron beam aligns with the linear movement direction of the rotating stage;

a second command device which outputs a second command signal for causing the electron beam to draw an element included in a predetermined pattern which is set with reference to the linear movement direction of the rotating stage driven by the stage driving device and a moving position of the electron beam deflected based on the first command signal; and a deflecting device which deflects the electron beam based on a command signal which added up the first command signal processed by the signal processing device and the second command signal output from the second command device.

2. The electron beam lithography apparatus according to claim 1, wherein the angle between the linear movement direction of the stage driven by the stage driving device and the deflection direction of the electron beam deflected by the first command signal from the first command device is not greater than three degrees.

3. The electron beam lithography apparatus according to claim 1, wherein the deflecting device can shift the electron beam by not less than ±5 μm on the resist on the substrate.

4. The electron beam lithography apparatus according to claim 2, wherein the deflecting device can shift the electron beam by not less than ±5 μm on the resist on the substrate.

5. The electron beam lithography apparatus according to claim 1, wherein the deflecting device can oscillate the electron beam with a responsivity of not less than 10 MHz.

6. The electron beam lithography apparatus according to claim 3, wherein the deflecting device can oscillate the electron beam with a responsivity of not less than 10 MHz.

7. The electron beam lithography apparatus according to claim 4, wherein the deflecting device can oscillate the electron beam with a responsivity of not less than 10 MHz.

8. A method for compensating for misalignment of an electron beam in the electron beam lithography apparatus according to claim 1, comprising the steps of:

linearly moving in one direction only the rotating stage with the stage driving device and drawing a marker with the electron beam on a linear movement path of the rotating stage;

outputting a first command signal for deflecting the electron beam in a linear movement direction of the rotating stage from the first command device and drawing a marker with the electron beam on a movement path of the electron beam; and measuring an angle between the linear movement direction of the rotating stage and a deflection direction of the electron beam deflected by the command signal from the first command device based on the two drawn markers, wherein the signal processing device processes the first command signal output from the first command device based on the measured angle so that the deflection direction of the electron beam aligns with the linear movement direction of the rotating stage.

9. An electron beam lithography apparatus for drawing a desired pattern by irradiating resist applied to a substrate with an electron beam, comprising:

a rotating stage which supports the substrate;

a stage driving device which moves the rotating stage linearly in one direction only;

a first command device which outputs a first command signal for deflecting the electron beam in a linear movement direction of the rotating stage;

a second command device which outputs a second command signal for causing the electron beam to draw an element included in a desired pattern which is set with reference to the linear movement direction of the rotating stage driven by the stage driving device and a moving position of the electron beam deflected based on the first command signal;

a compensating device which compensates for the second command signal output from the second command device for compensating for an error between an element actually drawn by the electron beam according to the second command signal from the second command device and the element included in the desired pattern; and a deflecting device which deflects the electron beam based on a command signal which added up the first command signal output from the first command device and the second command signal compensated for by the compensating device.

10. The electron beam lithography apparatus according to claim 9, wherein the compensating device has a conversion table storing a converted value for each command signal of the second command device for compensating for the command signal, and reads out from the conversion table a converted value corresponding to the command signal from the second command device and outputs the converted value.

11. The electron beam lithography apparatus according to claim 9, wherein the angle between the linear movement direction of the stage driven by the stage driving device and the deflection direction of the electron beam deflected by the first command signal from the first command device is not greater than three degrees.

12. The electron beam lithography apparatus according to claim 10, wherein the angle between the linear movement direction of the stage driven by the stage driving device and the deflection direction of the electron beam deflected by the first command signal from the first command device is not greater than three degrees.

13. The electron beam lithography apparatus according to claim 9, wherein the deflecting device can shift the electron beam by not less than ±5 μm on the resist on the substrate.

14. The electron beam lithography apparatus according to claim 12, wherein the deflecting device can shift the electron beam by not less than ±5 μm on the resist on the substrate.

15. The electron beam lithography apparatus according to claim 9, wherein the deflecting device can oscillate the electron beam with a responsivity of not less than 10 MHz.

16. The electron beam lithography apparatus according to claim 13, wherein the deflecting device can oscillate the electron beam with a responsivity of not less than 10 MHz.

17. The electron beam lithography apparatus according to claim 14, wherein the deflecting device can oscillate the electron beam with a responsivity of not less than 10 MHz.

18. A method for compensating for misalignment of an electron beam in the electron beam lithography apparatus according to claim 9, comprising the steps of:

linearly moving in one direction only the rotating stage with the stage driving device and drawing two or more markers including a reference marker with the electron beam on a linear movement path of the rotating stage;

outputting a predetermined command signal from the second command device for drawing with the electron beam a predetermined pattern with reference to a linear movement direction of the stage driven by the stage driving device and a position of the reference marker;

measuring the linear movement direction of the rotating stage based on positions of the two or more drawn markers and measuring the drawn predetermined pattern; and calculating, based on the measured linear movement direction of the rotating stage and the measured predetermined pattern, an error between the predetermined pattern drawn with reference to the linear movement direction of the rotating stage and the position of the reference marker and the predetermined pattern to be drawn according to the predetermined command signal, and obtaining compensation information for compensating for the command signal output from the first command device based on the calculated error, wherein the compensating device compensates for the command signal output from the second command device based on the compensation information and outputs the compensated command signal.

19. An electron beam lithography apparatus for drawing a desired pattern by irradiating resist applied to a substrate with an electron beam, comprising:
- a rotating stage which supports the substrate;
- a stage driving device which moves the rotating stage linearly in one direction only;
- a first command device which outputs a first command signal for deflecting the electron beam in a linear movement direction of the rotating stage;
- a signal processing device which processes the first command signal output from the first command device based on an angle between the linear movement direction of the rotating stage driven by the stage driving device and a deflection direction of the electron beam deflected by the first command signal from the first command device so that the deflection direction of the electron beam aligns with the linear movement direction of the rotating stage;
- a second command device which outputs a second command signal for causing the electron beam to draw an element included in a desired pattern which is set with reference to the linear movement direction of the stage driven by the rotating stage driving device and a moving position of the electron beam deflected based on the first command signal;
- a compensating device which compensates for the second command signal output from the second command device for compensating for an error between an element actually drawn by the electron beam according to the second command signal from the second command device and the element included in the desired pattern; and
- a deflecting device which deflects the electron beam based on a command signal which added up the first command signal processed by the signal processing device and the second command signal compensated for by the compensating device.

20. The electron beam lithography apparatus according to claim 19, wherein the compensating device has a conversion table storing a converted value for each command signal of the second command device for compensating for the command signal, and reads out from the conversion table a converted value corresponding to the command signal from the second command device and outputs the converted value.

21. The electron beam lithography apparatus according to claim 19, wherein the angle between the linear movement direction of the stage driven by the stage driving device and the deflection direction of the electron beam deflected by the first command signal from the first command device is not greater than three degrees.

22. The electron beam lithography apparatus according to claim 20, wherein the angle between the linear movement direction of the stage driven by the stage driving device and the deflection direction of the electron beam deflected by the first command signal from the first command device is not greater than three degrees.

23. The electron beam lithography apparatus according to claim 19, wherein the deflecting device can shift the electron beam by not less than ±5 μm on the resist on the substrate.

24. The electron beam lithography apparatus according to claim 22, wherein the deflecting device can shift the electron beam by not less than ±5 μm on the resist on the substrate.

25. The electron beam lithography apparatus according to claim 19, wherein the deflecting device can oscillate the electron beam with a responsivity of not less than 10 MHz.

26. The electron beam lithography apparatus according to claim 23, wherein the deflecting device can oscillate the electron beam with a responsivity of not less than 10 MHz.

27. The electron beam lithography apparatus according to claim 24, wherein the deflecting device can oscillate the electron beam with a responsivity of not less than 10 MHz.

28. A method for compensating for misalignment of an electron beam in the electron beam lithography apparatus according to claim 19, comprising the steps of:
- linearly moving in one direction only the rotating stage with the stage driving device and drawing a marker with the electron beam on a linear movement path of the rotating stage;
- outputting a first command signal for deflecting the electron beam in a linear movement direction of the rotating stage from the first command device and drawing a marker with the electron beam on a movement path of the electron beam; and
- measuring an angle between the linear movement direction of the rotating stage and a deflection direction of the electron beam deflected by the command signal from the first command device based on the two drawn markers, wherein the signal processing device processes the first command signal output from the first command device based on the measured angle so that the deflection direction of the electron beam aligns with the linear movement direction of the rotating stage.

29. A method for compensating for misalignment of an electron beam in the electron beam lithography apparatus according to claim 19, comprising the steps of:
- linearly moving the stage with the stage driving device and drawing two or more markers including a reference marker with the electron beam on a linear movement path of the stage;
- outputting a predetermined command signal from the second command device for drawing with the electron beam a predetermined pattern with reference to a linear movement direction of the stage driven by the stage driving device and a position of the reference marker;
- measuring the linear movement direction of the stage based on positions of the two or more drawn markers and measuring the drawn predetermined pattern; and
- calculating, based on the measured linear movement direction of the stage and the measured predetermined pattern, an error between the predetermined pattern drawn with reference to the linear movement direction of the stage and the position of the reference marker and the predetermined pattern to be drawn according to the predetermined command signal, and obtaining compensation information for compensating for the command signal output from the first command device based on the calculated error, wherein the compensating device compensates for the command signal output from the second command device based on the compensation information and outputs the compensated command signal.

* * * * *